US010269902B2

(12) United States Patent
Lin et al.

(10) Patent No.: US 10,269,902 B2
(45) Date of Patent: Apr. 23, 2019

(54) SEMICONDUCTOR DEVICE AND METHOD OF FORMATION

(71) Applicants: Taiwan Semiconductor Manufacturing Company Limited, Hsin-Chu (TW); National Taiwan University, Taipei (TW)

(72) Inventors: Meng-Yu Lin, New Taipei (TW); Shih-Yen Lin, Tainan (TW); Si-Chen Lee, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/852,391

(22) Filed: Dec. 22, 2017

(65) Prior Publication Data

US 2018/0122909 A1    May 3, 2018

Related U.S. Application Data

(60) Division of application No. 15/381,047, filed on Dec. 15, 2016, now Pat. No. 9,853,105, which is a
(Continued)

(51) Int. Cl.
*H01L 29/16*      (2006.01)
*H01L 29/66*      (2006.01)
(Continued)

(52) U.S. Cl.
CPC .... *H01L 29/1606* (2013.01); *H01L 29/42356* (2013.01); *H01L 29/42384* (2013.01);
(Continued)

(58) Field of Classification Search
CPC .......... H01L 29/1606; H01L 29/66015; H01L 29/1025; H01L 29/1029; H01L 29/78696;
(Continued)

(56) References Cited

U.S. PATENT DOCUMENTS 8,530,889 B2    9/2013   Jo et al.
2004/0126975 A1  7/2004   Ahmed et al.
(Continued)

FOREIGN PATENT DOCUMENTS

CN    103956383 A    7/2014
JP      5513955      6/2014
(Continued)

OTHER PUBLICATIONS

100-GHz Transistors from Wafer-Scale Epitaxial Graphene, Feb. 5, 2010, vol. 327 Science, Y.-M Lin, et al., www.sciencemag.org.
(Continued)

*Primary Examiner* — Thanhha S Pham
(74) *Attorney, Agent, or Firm* — Cooper Legal Group, LLC

(57) ABSTRACT

A semiconductor device and method of formation are provided. The semiconductor device includes a substrate, a first active area over the substrate, a second active area over the substrate, a graphene channel between the first active area and the second active area, and a first in-plane gate. In some embodiments, the graphene channel, the first in-plane gate, the first active area, and the second active area include graphene. A method of forming the first in-plane gate, the first active area, the second active area, and the graphene channel from a single layer of graphene is also provided.

20 Claims, 15 Drawing Sheets

Related U.S. Application Data continuation of application No. 14/455,992, filed on Aug. 11, 2014, now Pat. No. 9,525,072.

(51) Int. Cl.
- *H01L 29/10* (2006.01)
- *H01L 29/786* (2006.01)
- *H01L 29/423* (2006.01)
- *H01L 29/49* (2006.01)

(52) U.S. Cl.
CPC .... *H01L 29/42392* (2013.01); *H01L 29/4908* (2013.01); *H01L 29/66015* (2013.01); *H01L 29/78603* (2013.01); *H01L 29/78648* (2013.01); *H01L 29/78684* (2013.01); *H01L 29/78696* (2013.01); *H01L 2924/13088* (2013.01)

(58) Field of Classification Search
CPC ......... H01L 29/78603; H01L 29/42392; H01L 29/4908; H01L 29/66787; H01L 29/66795; H01L 29/78648
See application file for complete search history.

(56) References Cited

U.S. PATENT DOCUMENTS

| | | | |
|---|---|---|---|
| 2010/0102292 A1 | 4/2010 | Hiura et al. | |
| 2013/0287956 A1* | 10/2013 | Patil | B01J 37/34 427/333 |
| 2014/0158988 A1 | 6/2014 | Chen et al. | |
| 2014/0319452 A1* | 10/2014 | Seabaugh | H01L 29/1606 257/9 |
| 2015/0270406 A1* | 9/2015 | Sun | H01L 29/78606 257/29 |

FOREIGN PATENT DOCUMENTS

| | | |
|---|---|---|
| KR | 10-2005-0062656 | 6/2005 |
| KR | 10-2011-0021772 | 3/2011 |
| WO | 2003023510 A1 | 3/2003 |
| WO | 2008108383 A1 | 9/2008 |

OTHER PUBLICATIONS

Nanotechnology, Mar. 23, 2012, vol. 23, No. 11, G Jo, et al.
Graphitic carbon film formation under Ni templates by radio-frequency sputtering for transparent electrode applications, Oct. 7, 2011, J. Vac. Sci. Technol. B 29(6), Meng-Yu Lin et al.
Direct Formation of Wafer Scale Graphene Thin Layers on Insulating Substrates by Chemical Vapor Deposition, Aug. 11, 2011,pp. 3612-3616, Ching-Yuan Su et al., pubs.acs.org/Nanolett.
Realization of a high mobility dual-gated graphene field-effect transistor with Al2O3 dielectric, Feb. 12, 2009, Seyoung Kim et al., Applied Physics Letters 94, http://dx.doi.org/10.1063/1.3077021.
Corresponding Korean application 10-2014-0187165, Korean Office action dated Dec. 15, 2015, 13 pages.

* cited by examiner

SEMICONDUCTOR DEVICE AND METHOD OF FORMATION

RELATED APPLICATION

This application is a divisional of and claims priority to U.S. patent application Ser. No. 15/381,047, titled "SEMICONDUCTOR DEVICE AND METHOD OF FORMATION" and filed on Dec. 15, 2016, which is a continuation of and claims priority to U.S. patent application Ser. No. 14/455,992, titled "SEMICONDUCTOR DEVICE AND METHOD OF FORMATION" and filed on Aug. 11, 2014. U.S. patent application Ser. Nos. 15/381,047 and 14/455,992 are incorporated herein by reference.

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
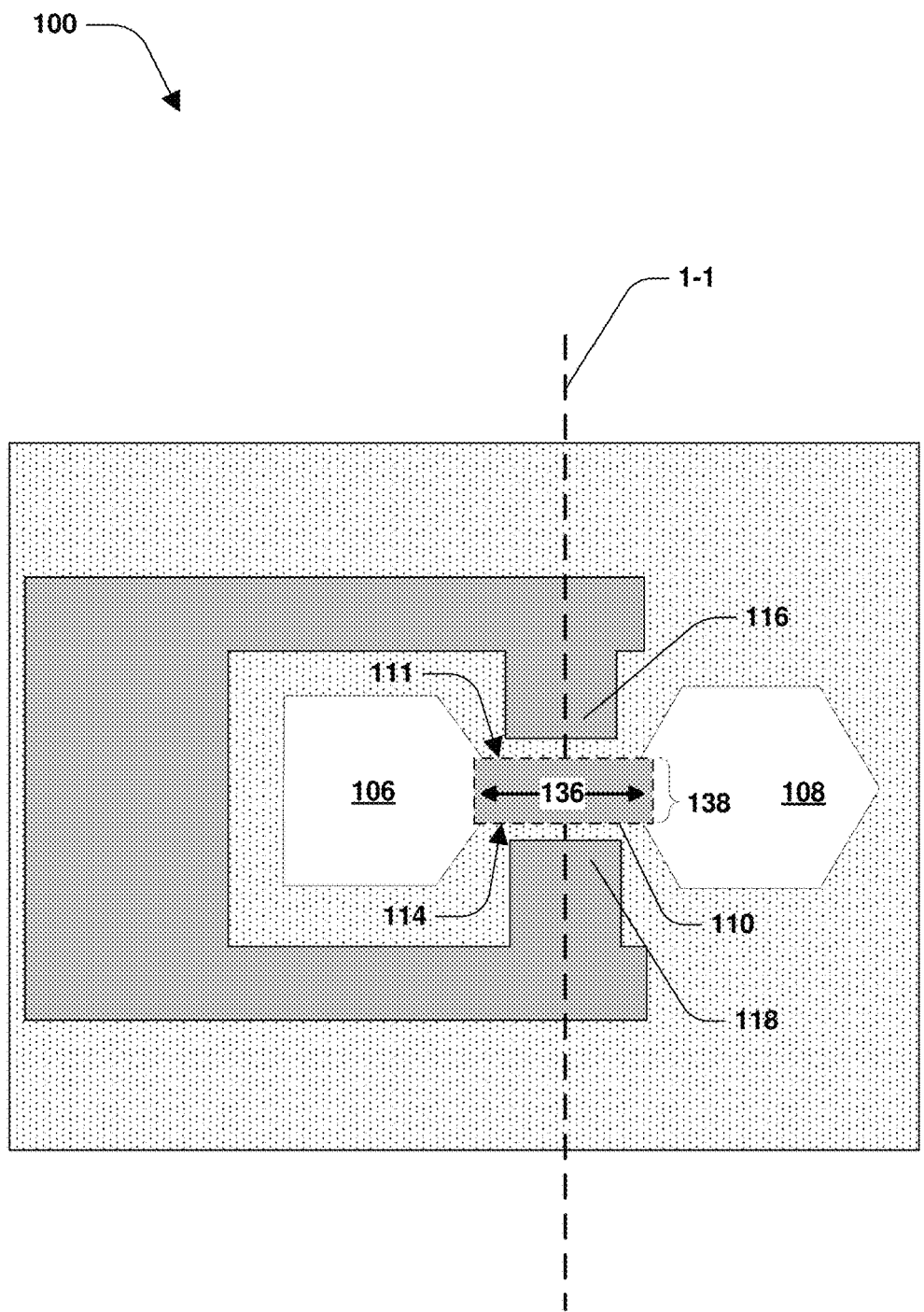
FIG. 1 is an illustration of a top down view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein. Some embodiments of the present disclosure have one or a combination of the following features and/or advantages.

According to some embodiments, a semiconductor device comprises a graphene channel between a first active area and a second active area. In some embodiments, the graphene channel comprises a first side proximate a first in-plane gate and a second side proximate a second in-plane gate. In some embodiments, at least one of the first in-plane gate or the second in-plane gate comprises at least one of nickel, copper, gold, etc. In yet another embodiment, at least one of the first in-plane gate, the second in-plane gate, the first active area, or the second active area comprises graphene. In some embodiments, by forming at least one of the first in-plane gate, the second in-plane gate, the first active area, or the second active area from graphene, a height difference between the graphene channel and at least one of the first in-plane gate, the second in-plane gate, the first active area, or the second active area is reduced. In some embodiments, replacing at least one of the first in-plane gate, the second in-plane gate, the first active area, or the second active area with graphene simplifies the fabrication process for the semiconductor device.

Figure 2:
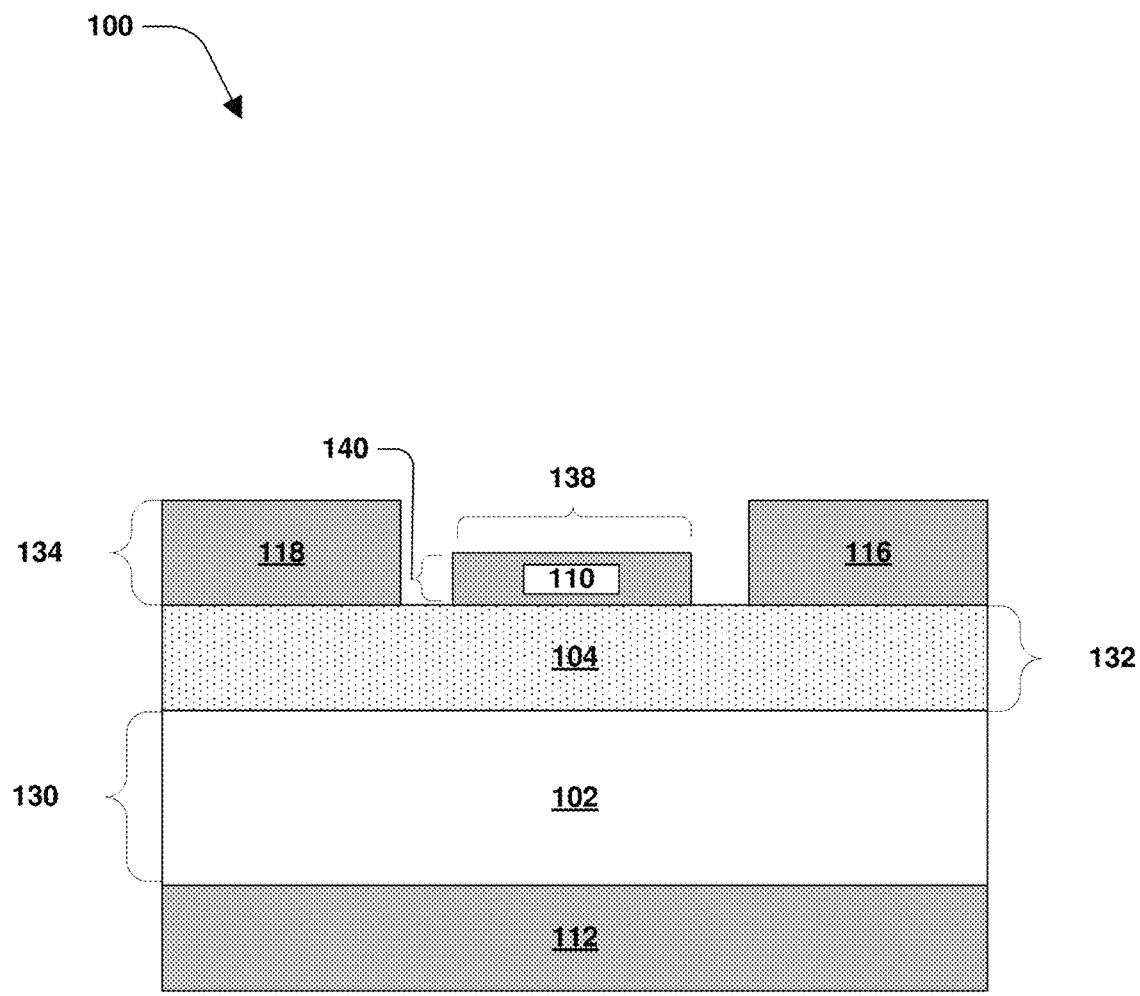
FIG. 2 is an illustration of a cross sectional view of a semiconductor device in accordance with some embodiments.
Figure 3:
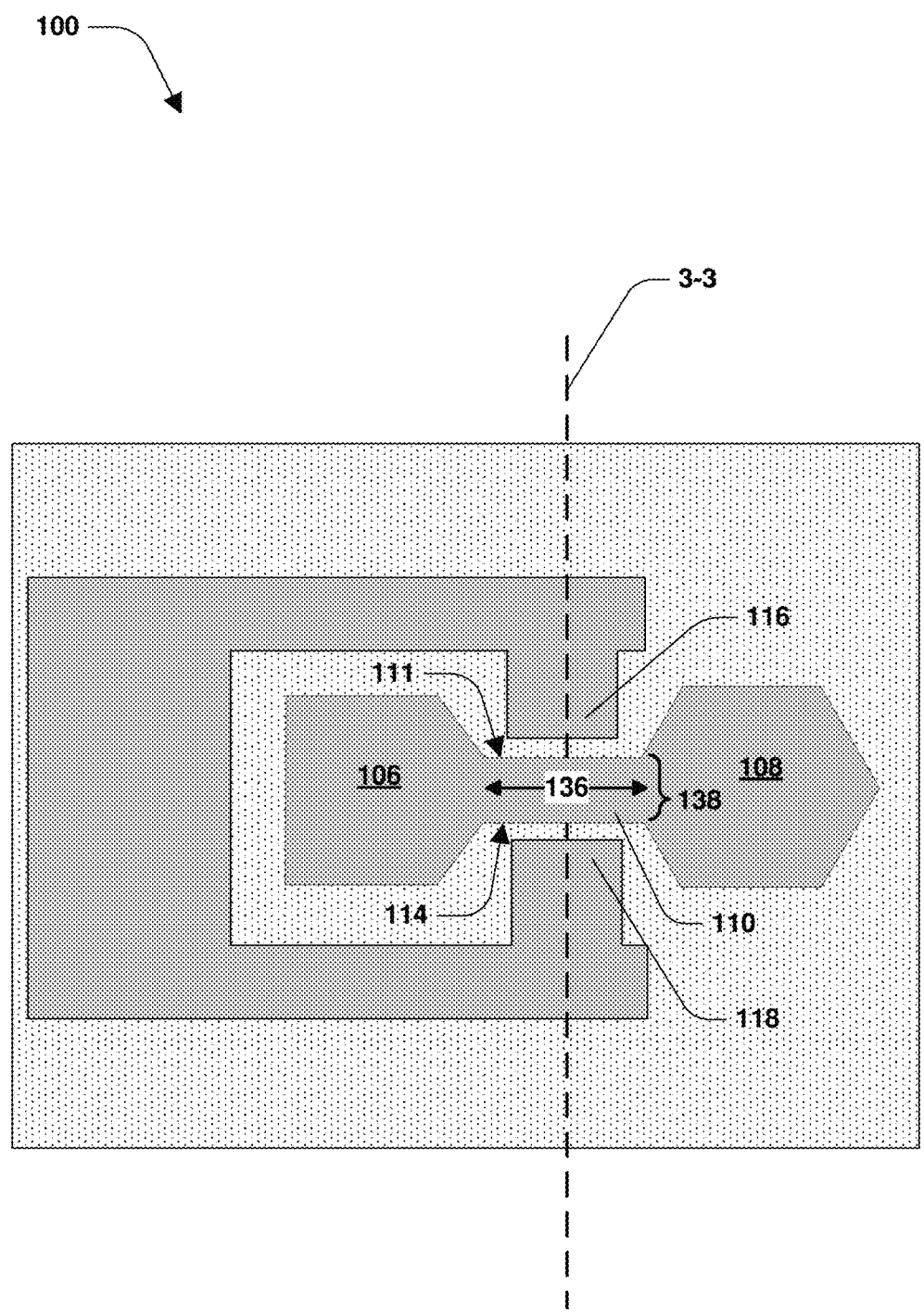
FIG. 3 is an illustration of a top down view of a semiconductor device in accordance with some embodiments.
Figure 4:
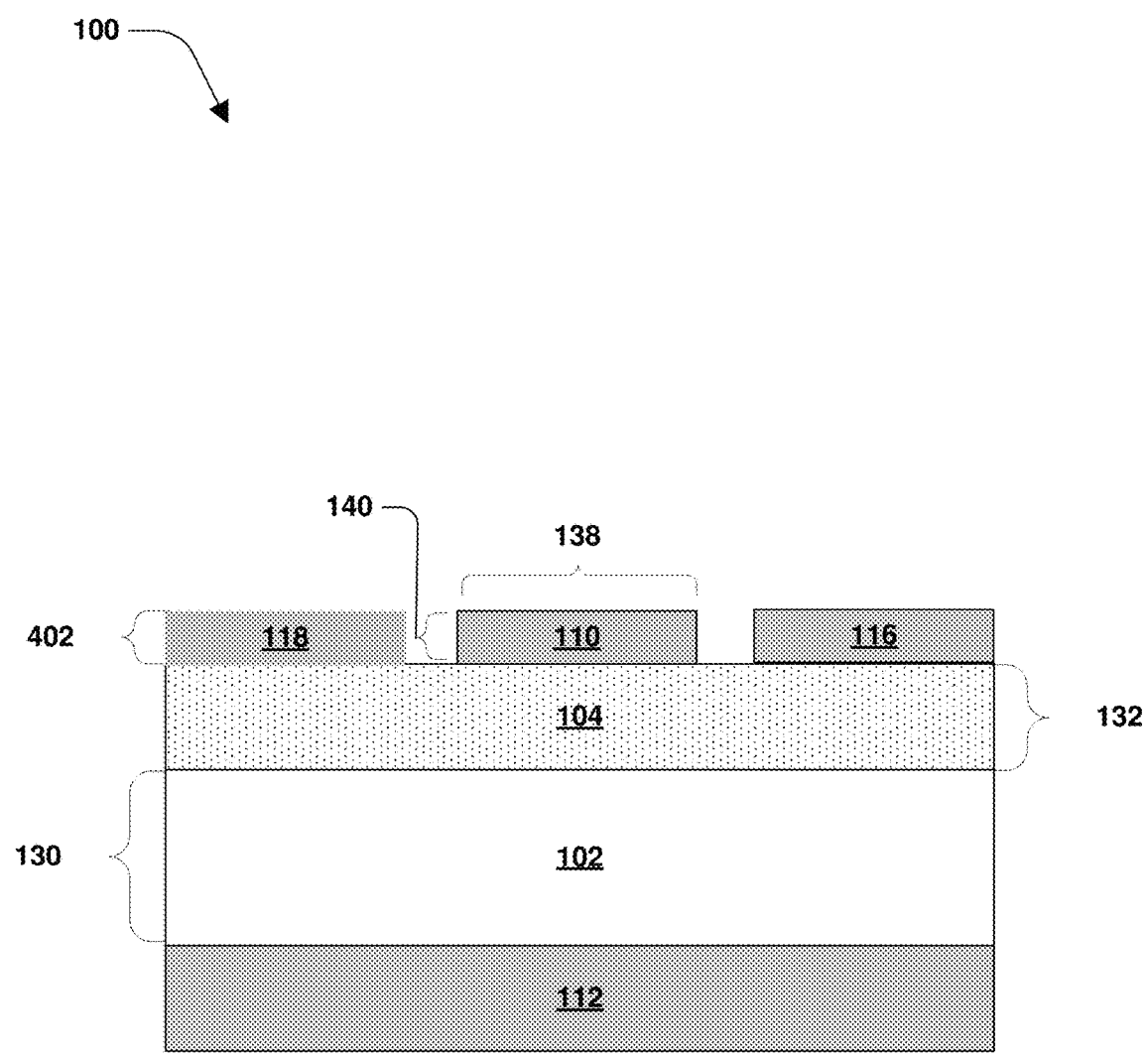
FIG. 4 is an illustration of a cross sectional view of a semiconductor device in accordance with some embodiments.

FIGS. 1 and 3 are top down views of the semiconductor device 100, and FIGS. 2 and 4 are cross-sectional views of the semiconductor device 100, according to some embodiments. Turning to FIGS. 1 and 2, where FIG. 2 illustrates a cross section of the semiconductor device 100 taken along line 1-1 in FIG. 1, according to some embodiments. In some embodiments, a dielectric layer 104 is formed over a substrate 102, as illustrated in FIG. 2. In some embodiments, the substrate 102 comprises at least one of silicon, germanium, carbon, etc. In some embodiments, the substrate 102 comprises silicon. In some embodiments, the substrate 102 includes at least one of an epitaxial layer, a silicon-on-insulator (SOI) structure, a wafer, or a die formed from a wafer. In some embodiments, the substrate 102 has a first thickness 130. In some embodiments, the first thickness 130 is between about 350 micrometers to about 525 micrometers. In some embodiments, the dielectric layer 104 comprises at least one of an oxide, a nitride, etc. In some embodiments, the dielectric layer 104 comprises a silicon oxide, such as $SiO_2$. In some embodiments, the dielectric layer 104 includes at least one of an epitaxial layer, a silicon-on-insulator (SOI) structure, a wafer, or a die formed from a wafer. In some embodiments, the dielectric layer 104 has a second thickness 132. In some embodiments, the second thickness 132 is between about 10 nanometers to about 300 nanometers.

In some embodiments, the semiconductor device 100 comprises a first active area 106 and a second active area 108. In some embodiments, at least one of the first active area 106 or the second active area 108 comprises at least one of a source or a drain. In some embodiments, the first active area 106 comprises at least one of a first conductivity type or a second conductivity type. In some embodiments, the second active area 108 comprises at least one of the first conductivity type or the second conductivity type. In some embodiments, the first conductivity type comprises at least one of n-type or p-type. In some embodiments, the first conductivity type comprises n-type when the second conductivity type comprises p-type and the second conductivity type comprises n-type when the first conductivity type comprises p-type. In some embodiments, at least one of the first active area 106 or the second active area 108 has a third thickness 134. In some embodiments, the third thickness 134 is between about 50 nanometers to about 100 nanometers.

In some embodiments, a graphene channel 110 is formed over the substrate 102. In some embodiments, the graphene channel 110 is formed over the dielectric layer 104. In some embodiments, the graphene channel 110 comprises graphene. In some embodiments, the graphene channel 110 comprises about 70% graphene to about 90% graphene. In some embodiments, the graphene channel 110 is between the first active area 106 and the second active area 108. In some embodiments, the graphene channel 110 has a first side 111 and a second side 114. In some embodiments, the graphene channel 110 has a channel length 136, as illustrated in FIG. 1. In some embodiments, the channel length 136 is between about 5 micrometer to about 75 micrometers. In some embodiments, the channel length 136 is between about 25 micrometers to about 35 micrometers. In some embodiments, the graphene channel 110 has a channel width 138, as illustrated in FIG. 2. In some embodiments, the channel width 138 is between about 1 micrometer to about 25 micrometers. In some embodiments, the channel width 138 is between about 5 micrometers to about 15 micrometers. In some embodiments, the graphene channel 110 has a channel height 140. In some embodiments, the channel height 140 is between about 1 angstrom to about 500 angstroms.

In some embodiments, the semiconductor device 100 comprises at least one of a first in-plane gate 116 or a second in-plane gate 118. In some embodiments, at least one of the in-plane gates 116-118 is located in the same plane or layer as an electrode for which it performs a gating function, such as applying a bias. In some embodiments, at least one of the in-plane gates 116-118 applies at least one of a first bias or a second bias to the semiconductor device 100. In some embodiments, at least one of the in-plane gates 116-118 is in the same plane as at least one of the graphene channel 110, the first active area 106, or the second active area 108. In some embodiments, at least one of the in-plane gates 116-118 is proximate at least one of the first side 111 or the second side 114 of the graphene channel 110. In some embodiments, the first in-plane gate 116 is proximate the first side 111 of the graphene channel 110 and the second in-plane gate 118 is proximate the second side 114 of the graphene channel 110. In some embodiments, the first in-plane gate 116 is connected to the second in-plane gate 118. In some embodiments, at least one of the in-plane gates 116-118 comprises at least one of nickel, copper, graphene, gold, etc. In some embodiments, the utilization of at least one of the in-plane gates 116-118 improves the electron mobility of the semiconductor device 100 by positioning at least one of the in-plane gates 116-118 in the same plane as at least one of the graphene channel 110, the first active area 106, or the second active area 108. In some embodiments, at least one of the in-plane gates 116-118 is used to modulate a Fermi level of the graphene channel 110. In some embodiments, a bottom gate 112 modulated drain current characteristics will yield different doping result by applying the in-plane gates 116-118.

In some embodiments, the semiconductor device 100 comprises a bottom gate 112, as illustrated in FIG. 2. In some embodiments, the bottom gate 112 is located under the substrate 102. In some embodiments, the bottom gate 112 applies a third bias to the semiconductor device 100. In some embodiments, the bottom gate comprises at least one of nickel, copper, gold, etc.

Turning to FIGS. 3 and 4, where FIG. 4 illustrates a cross section of the semiconductor device 100 taken along line 3-3 in FIG. 3, according to some embodiments. In some embodiments, at least one of the first in-plane gate 116, the second in-plane gate 118, the first active area 106, the second active area 108 or the graphene channel 110 comprises graphene. In some embodiments, at least one of the first in-plane gate 116, the second in-plane gate 118, the first active area 106, the second active area 108 or the graphene channel 110 is formed from a graphene layer. In some embodiments, at least one of the first in-plane gate 116, the second in-plane gate 118, the first active area 106, the second active area 108 or the graphene channel 110 is formed by etching the graphene layer. In some embodiments, at least one of the first in-plane gate 116, the second in-plane gate 118, the first active area 106, the second active area 108, or the graphene channel 110 is formed from a first layer of graphene stacked over a second layer of graphene (not shown). In some embodiments, at least one of the first in-plane gate 116, the second in-plane gate 118, the first active area 106, or the second active area 108 has a fourth thickness 402. In some embodiments, the fourth thickness 402 is between about 1 angstrom to about 500 angstroms. In some embodiments, the fourth thickness 402 is substantially the same as the channel height 140. In some embodiments, forming at least one of the first in-plane gate 116, the second in-plane gate 118, the first active area 106, or the second active area 108 from a single graphene layer reduces a height difference between the graphene channel 110 and at least one of the first in-plane gate 116, the second in-plane gate 118, the first active area 106, or the second active area 108. In some embodiments, forming at least one of the first in-plane gate 116, the second in-plane gate 118, the first active area 106, or the second active area 108 from the same graphene layer simplifies the fabrication process for the semiconductor device 100.

Figure 5:
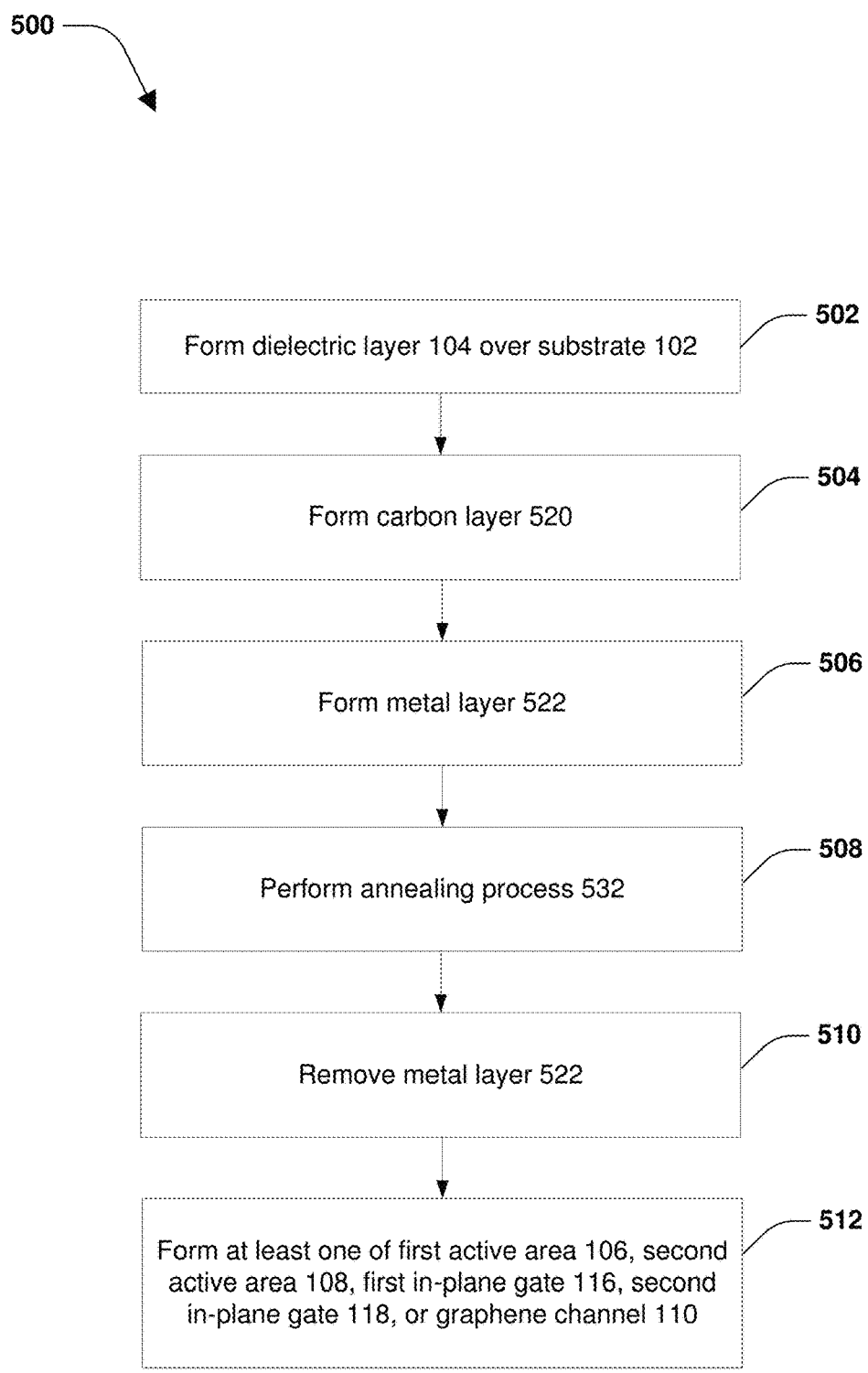
FIG. 5 is a flow diagram illustrating a method of making a semiconductor device, in accordance with some embodiments.
Figure 6:
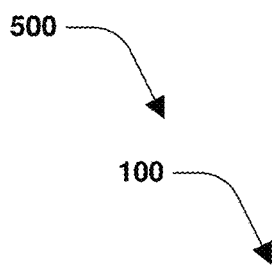
FIG. 6 is an illustration of a cross sectional view of a semiconductor device at a stage of fabrication, in accordance with some embodiments.
Figure 6:
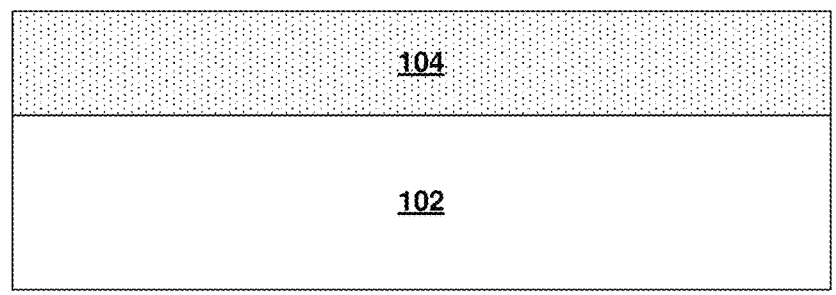
Figure 7:
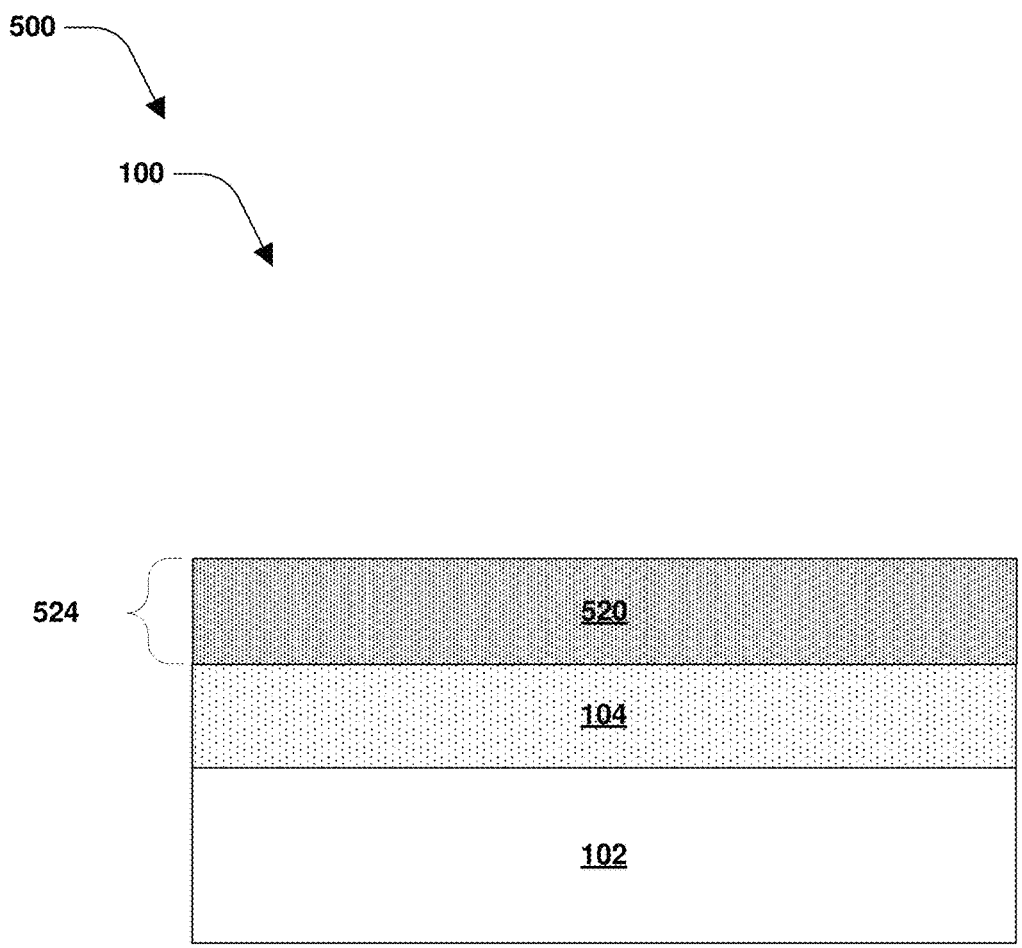
FIG. 7 is an illustration of a cross sectional view of a semiconductor device at a stage of fabrication, in accordance with some embodiments.

Turing to FIG. 5, a method 500 of forming the semiconductor device 100 is provided, according to some embodiments. At 502, a dielectric layer 104 is formed over a substrate 102, as illustrated in FIG. 6. In some embodiments, at least one of the substrate 102 or the dielectric layer 104 comprises at least one of silicon or silicon oxide. At 504, a carbon layer 520 is formed, such as by deposition, over the dielectric layer 104, as illustrated in FIG. 7. In some embodiments, the carbon layer 520 is an amorphous carbon layer. In some embodiments, the carbon layer 520 is deposited by a sputtering process. In some embodiments, the sputtering process comprises a radio frequency (RF) sputtering process. In some embodiments, the carbon layer 520 is deposited with a plasma power of about 50 watts to about 150 watts for about 5 minutes to about 20 minutes. In some embodiments, the carbon layer 520 is deposited for 11 minutes with the plasma power of 90 watts. In some embodiments, the carbon layer 520 has a fifth thickness 524. In some embodiments, the fifth thickness 524 is between about 10 nanometers to about 500 nanometers.

Figure 8:
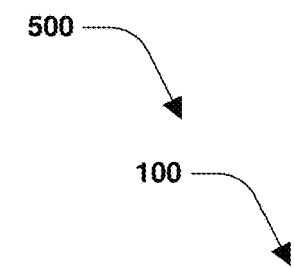
FIG. 8 is an illustration of a cross sectional view of a semiconductor device at a stage of fabrication, in accordance with some embodiments.
Figure 8:
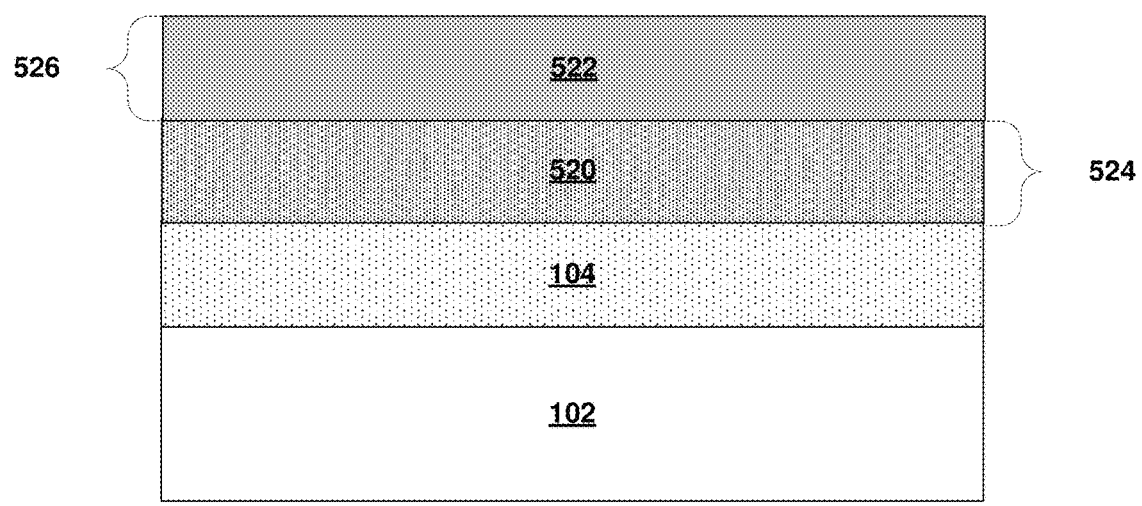
Figure 9:
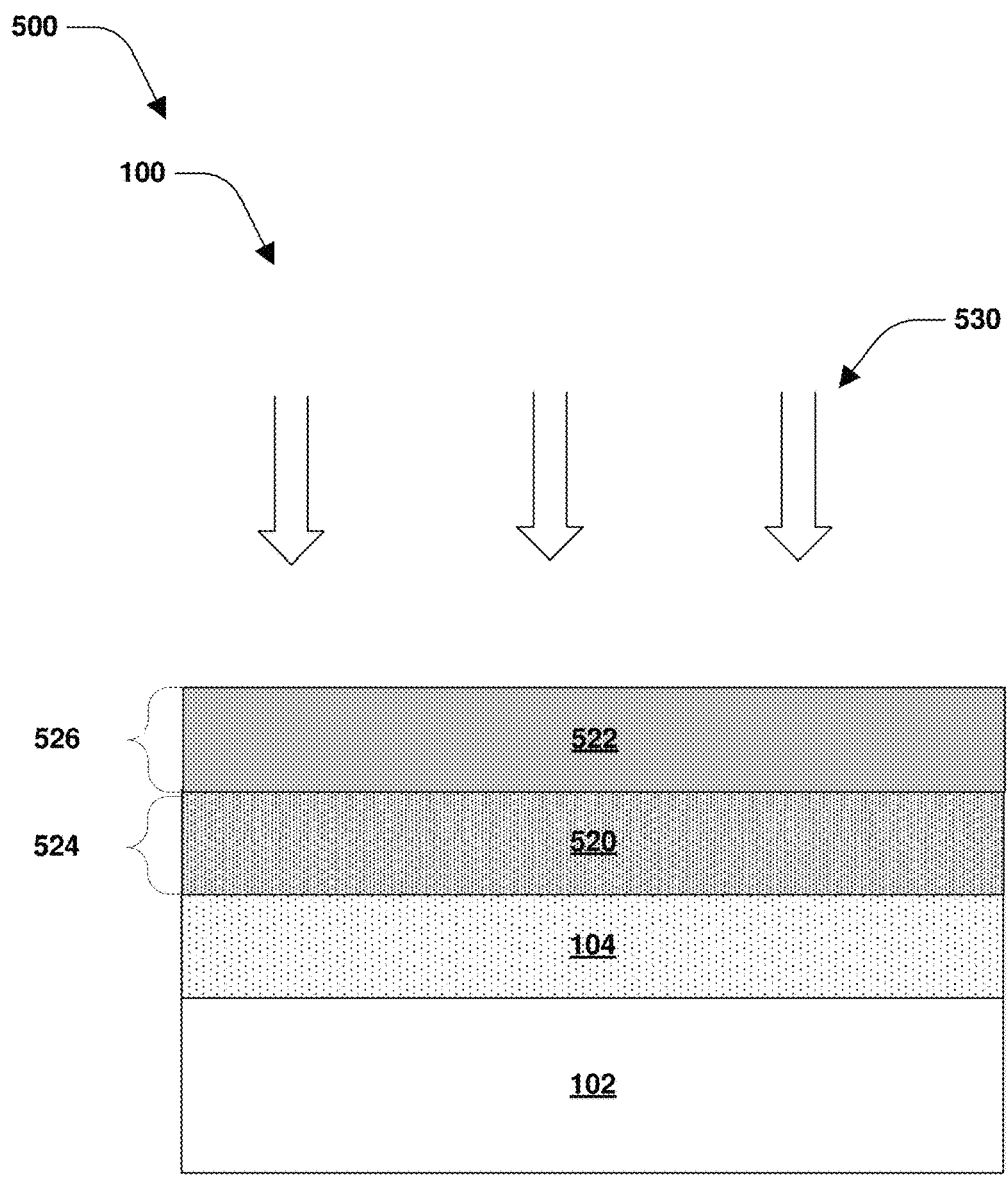
FIG. 9 is an illustration of a cross sectional view of a semiconductor device at a stage of fabrication, in accordance with some embodiments.
Figure 10:
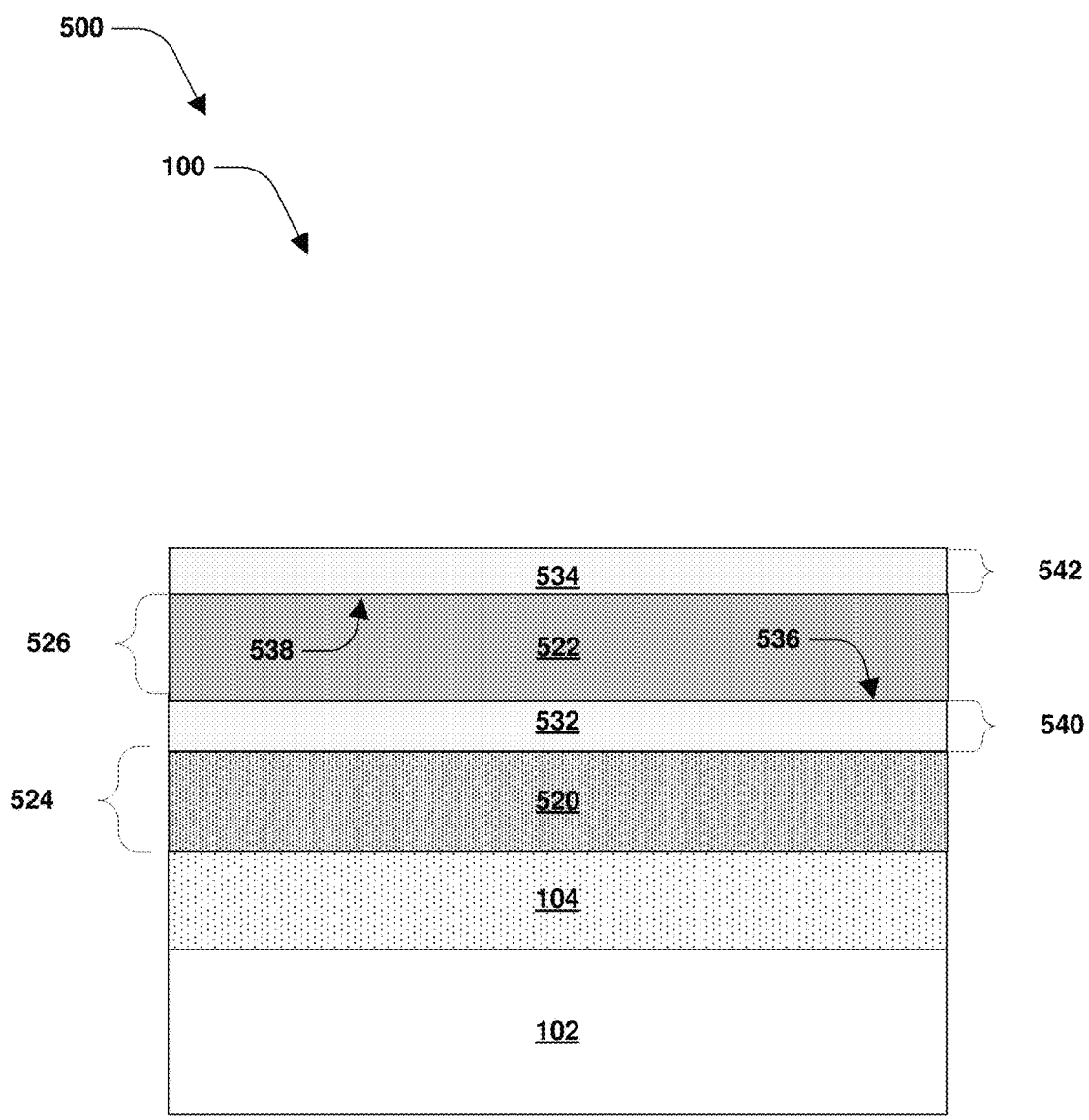
FIG. 10 is an illustration of a cross sectional view of a semiconductor device at a stage of fabrication, in accordance with some embodiments.

At 506, a metal layer 522 is formed, such as by deposition, as illustrated by FIG. 8. In some embodiments, the metal layer 522 comprises at least one of nickel, copper, etc. In some embodiments, the metal layer 522 has a sixth thickness 526. In some embodiments, the sixth thickness 526 is between about 50 nanometers to about 500 nanometers. In some embodiments, the metal layer 522 is deposited with a plasma power of between about 20 to about 80 watts. In some embodiments, the metal layer 522 is deposited on the carbon layer 520 where graphene is to be formed. At 508, an annealing process 530 is performed, as illustrated in FIG. 9. In some embodiments, the annealing process 530 is performed at a temperature of between about 750° C. to about 1200° C. In some embodiments, the annealing process 530 is performed for about 10 minutes to about 20 minutes. In some embodiments, a second annealing process is performed. In some embodiments, during the annealing process, the carbon layer 520 is transformed into at least one of graphene layers 532-534. In some embodiments, a first graphene layer 532 is formed on a bottom surface 536 of the metal layer 522 and a second graphene layer 534 is formed on a top surface 538 of the metal layer 522, as illustrated in FIG. 10. In some embodiments, the first graphene layer 532 has a seventh thickness 540. In some embodiments, the second graphene layer 534 has an eighth thickness 542. In some embodiments, at least one of the seventh thickness 540 or the eighth thickness 542 is between about 1 angstrom to about 500 angstroms.

Figure 11:
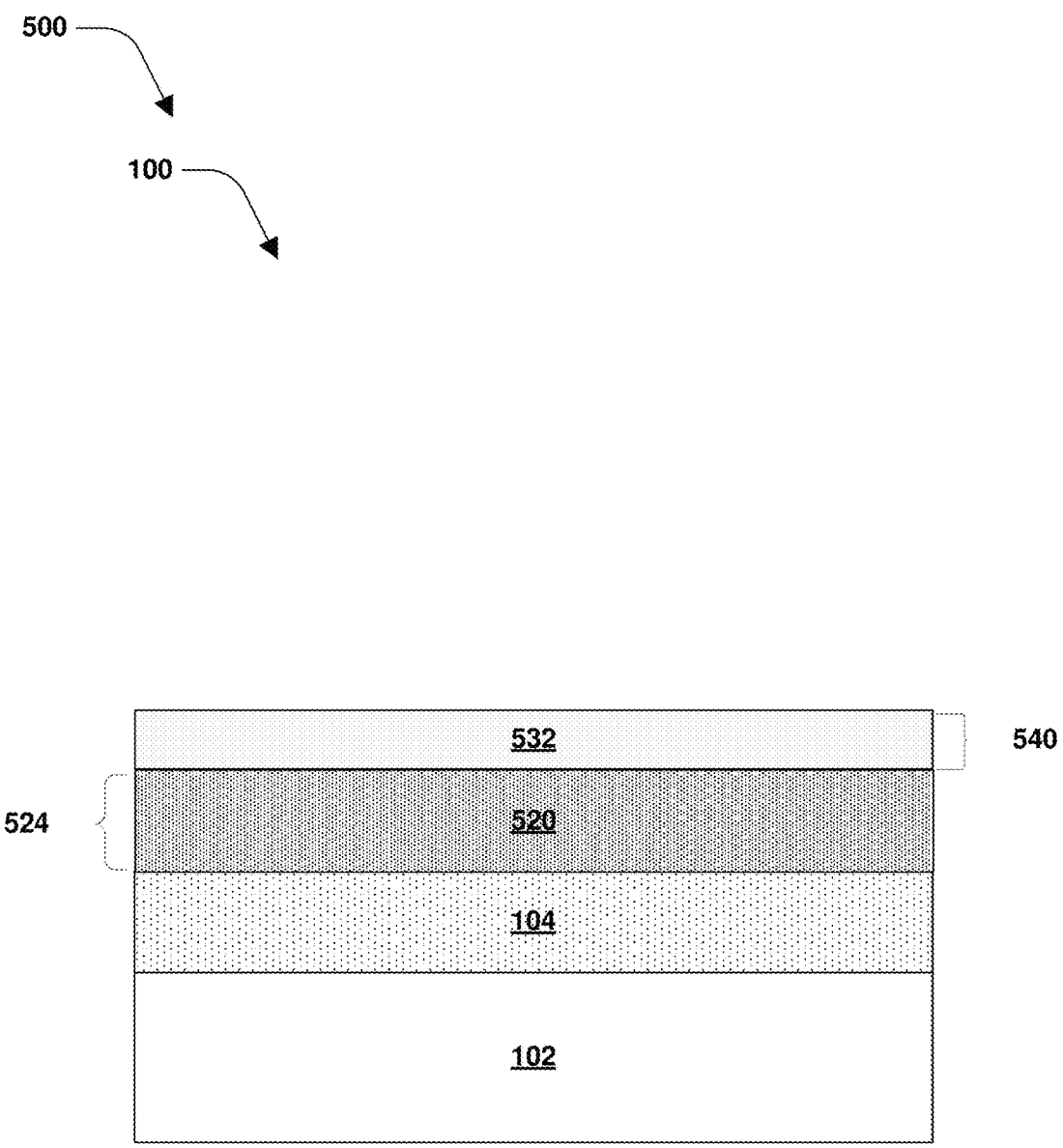
FIG. 11 is an illustration of a cross sectional view of a semiconductor device at a stage of fabrication, in accordance with some embodiments.
Figure 12:
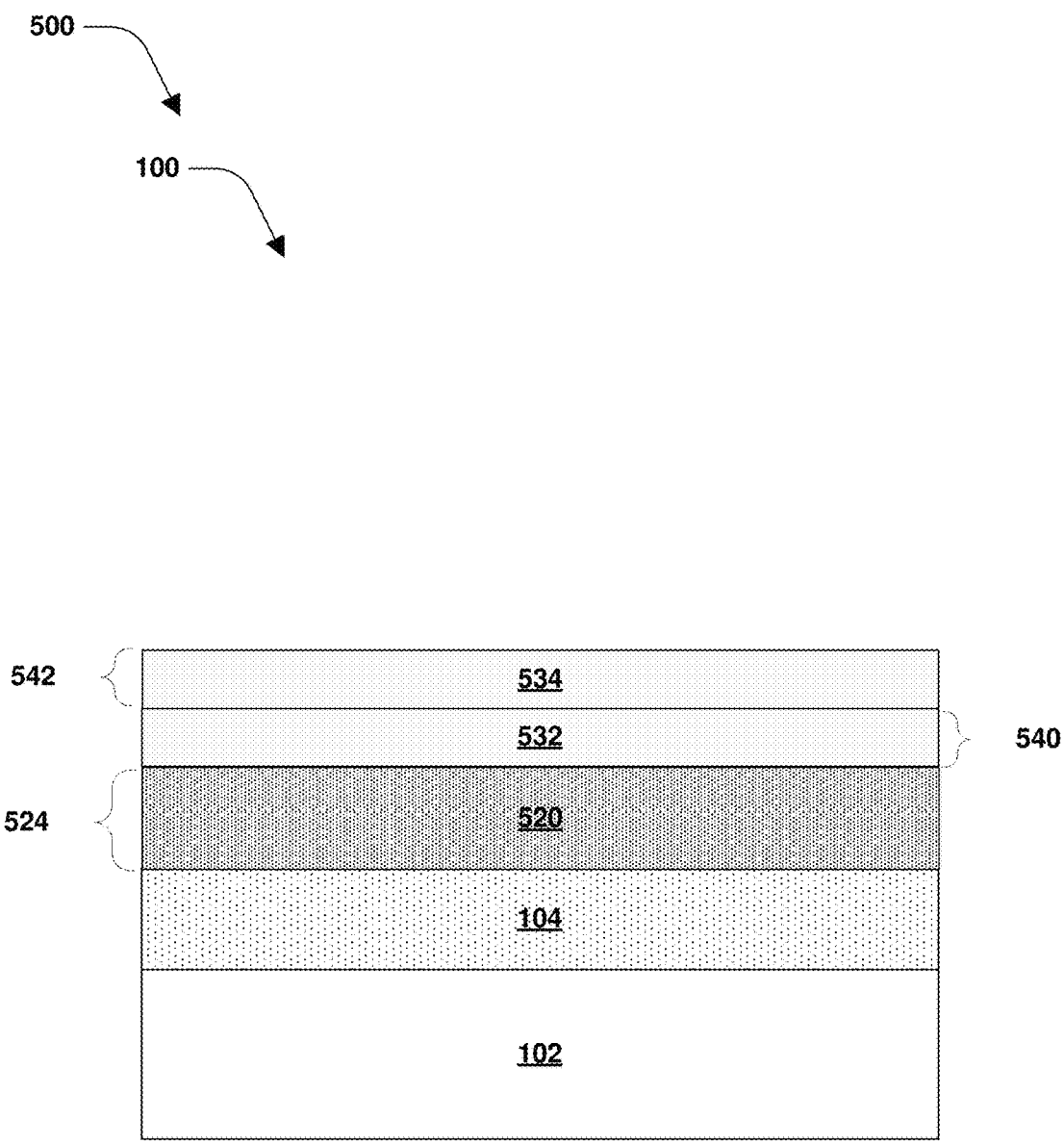
FIG. 12 is an illustration of a cross sectional view of a semiconductor device at a stage of fabrication, in accordance with some embodiments.
Figure 13:
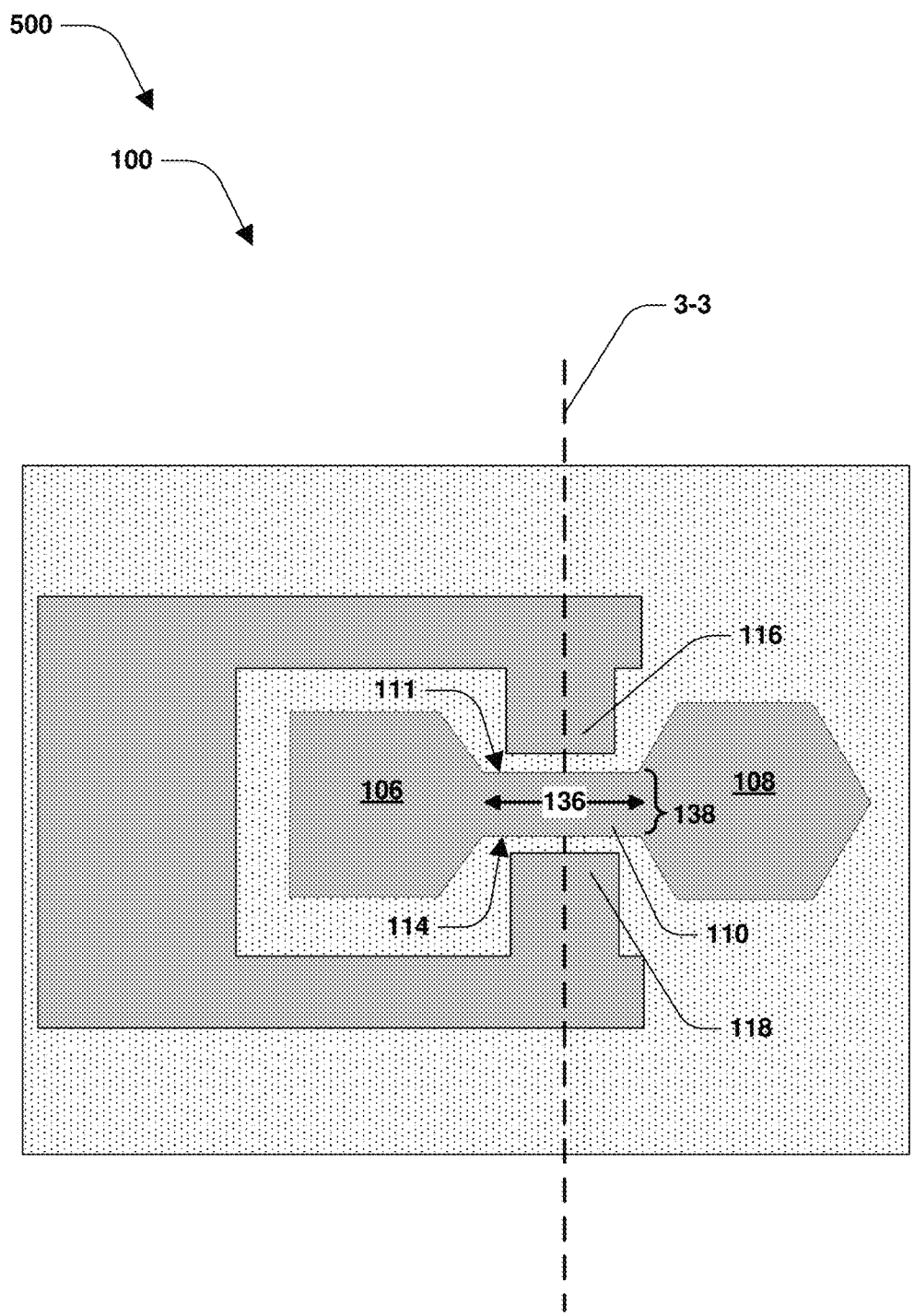
FIG. 13 is an illustration of a top down view of a semiconductor device at a stage of fabrication, in accordance with some embodiments.

At 510, at least one of the metal layer 522 or the second graphene layer 534 is removed, as illustrated in FIG. 11. In some embodiments, the metal layer 522 is removed by treating the metal layer 522 with an acid solution. In some embodiments, the acid solution comprises about 10% hydrochloric acid. In some embodiments, the second graphene layer 534 on the top surface 538 of the metal layer 522 is removed by an oxygen plasma process. In some embodiments, the second graphene layer 534 is deposited on the first graphene layer 532 after the metal layer 528 has been removed, as illustrated in FIG. 12. In some embodiments, the second graphene layer 534 is discarded. At 512, at least one of a first active area 106, a second active area 108, a first in-plane gate 116, a second in-plane gate 118, or a graphene channel 110 is formed. In some embodiments, at least one of the graphene layers 532-534 are etched to define at least one of the first active area 106, the second active area 108, the first in-plane gate 116, the second in-plane gate 118, or the graphene channel 110, as illustrated by the top down view of the semiconductor device 100 of FIG. 13.

Figure 14:
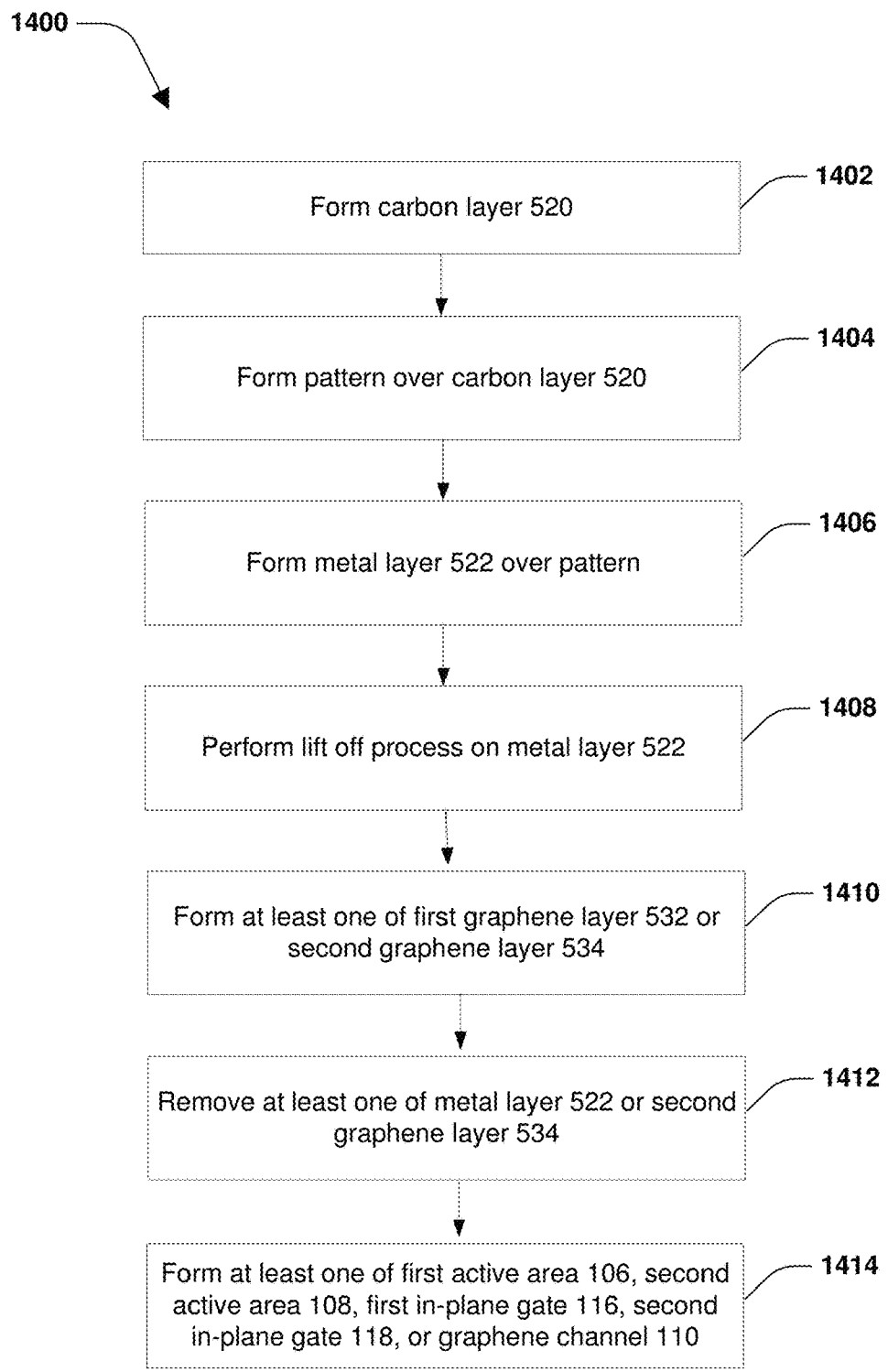
FIG. 14 is a flow diagram illustrating a method of making a semiconductor device, in accordance with some embodiments.

Turing to FIG. 14, a method 1400 of forming the semiconductor device 100 is provided, according to some embodiments. At 1402, a carbon layer 520 is formed, such as by deposition, over at least one of a substrate 102 or a dielectric layer 104. In some embodiments, the carbon layer 520 is an amorphous carbon layer. At 1404, a pattern is formed on the carbon layer 520. In some embodiments, the pattern is formed by a photolithography process. In some embodiments, the pattern is defined by a photoresist. At 1406, a metal layer 522 is deposited over the pattern. In some embodiments, the metal layer 522 is deposited by a sputtering process. In some embodiments, the metal layer 522 comprises at least one of copper, nickel, gold, etc.

At 1408, a lift off process is performed on the metal layer 522. In some embodiments, the photoresist under the metal layer 522 is removed, as well as the metal layer 522 under the photoresist. In some embodiments, the photoresist is removed with a solvent. In some embodiments, the solvent is at least one of hydrochloric acid or ferric nitrate. At 1410, at least one of a first graphene layer 532 or second graphene layer 534 is formed. In some embodiments, at least one of the first graphene layer 532 or the second graphene layer 534 is formed by an annealing process. In some embodiments, the annealing process is performed at a temperature of between about 750° C. to about 1200° C. In some embodiments, the annealing process is performed for about 10 minutes to about 20 minutes. In some embodiments, the first graphene layer 532 is between the dielectric layer 104 and the metal layer 522. In some embodiments, at least one of the first graphene layer 532 or the second graphene layer 534 is produced by at least one of segregation or precipitation of a carbon species from the carbon layer 520. At 1412, at least one of the second graphene layer 534 or the metal layer 522 is removed. In some embodiments, the metal layer 522 is removed by at least one of an etching process or by submersion in a solvent, such as hydrochloric acid or ferric nitrate. In some embodiments, the second graphene layer 534 is removed by an oxygen plasma process. At 1414, at least one of a first active area 106, a second active area 108, a first in-plane gate 116, a second in-plane gate 118, or a graphene channel 110 is formed.

Figure 15:
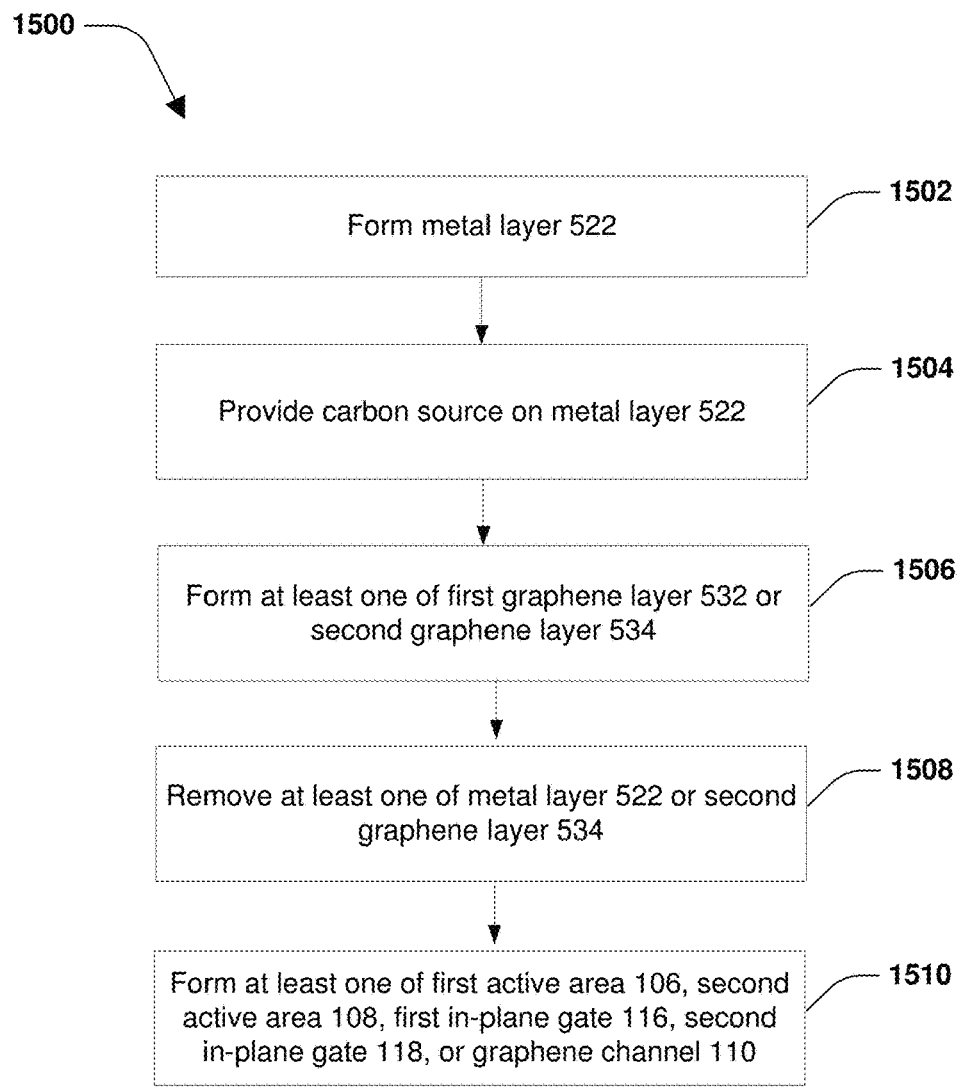
FIG. 15 is a flow diagram illustrating a method of making a semiconductor device, in accordance with some embodiments.

Turning to FIG. 15, a method 1500 of forming a semiconductor device 100 is provided, according to some embodiments. At 1502, a metal layer 522 is formed, such as by deposition, over at least one of a substrate 102 or dielectric layer 104. In some embodiments, the metal layer 522 is deposited by a sputtering process. In some embodiments, the metal layer 522 is deposited in a pattern or over a template. In some embodiments, the metal layer 522 comprises at least one of copper, nickel, gold, etc. In some embodiments, the metal layer 522 is about 300 nanometers thick. At 1504, a carbon source is provided. In some embodiments, the carbon source comprises at least one of methane, ethane, propane, butane, etc. In some embodiments, the carbon source comprises dissociated carbon atoms, such as from methane, ethane, propane, butane, etc.

In some embodiments, the carbon source is dissociated on the metal layer 522. At 1506, at least one of a first graphene layer 532 or a second graphene layer 534 is formed. In some embodiments, at least one of the graphene layers 532-534 are formed by at least one of a chemical vapor deposition (CVD) process or molecular beam epitaxy (MBE) process. In some embodiments, at least one of the graphene layers 532-534 are formed by placing the semiconductor device 100 in an oven with a gas mixture. In some embodiments, the gas mixture comprises a mixture of at least one of methane, ethane, propane, nitrogen, hydrogen, etc. In some embodiments, the semiconductor device 100 is placed in the oven for about 2 minutes to about 15 minutes. In some embodiments, the oven is maintained at a temperature of about 850° C. to about 1200° C. In some embodiments, the oven is maintained at a temperature of about 900° C.

At 1508, at least one of second graphene layer 534 or the metal layer 522 is removed. In some embodiments, second graphene layer 534 is removed by an oxygen plasma process. In some embodiments, the metal layer 522 is removed by an etching process. In some embodiments, the etching process utilizes a wet etchant, such as ferric nitrate, hydrochloric acid, phosphoric acid, etc. In some embodiments, the second graphene layer 534 is deposited on the first graphene layer 532. At 1510, at least one of a first active area 106, a second active area 108, a first in-plane gate 116, a second in-plane gate 118, or a graphene channel 110 is formed. In some embodiments, at least one of the first active area 106, the second active area 108, the first in-plane gate 116, the second in-plane gate 118 or the graphene channel 110 is formed from at least one of the graphene layers 532-534. In some embodiments, at least one of the first active area 106, the second active area 108, the first in-plane gate 116, or the second in-plane gate 118 is formed from at least one of gold, copper, nickel, etc.

According to some embodiments, a semiconductor device comprises a substrate, a first active area over the substrate, a second active area over the substrate, a graphene channel between the first active area and the second active area, and a first in-plane gate. In some embodiments, the graphene channel has a first side and a second side. In some embodiments, the first in-plane gate is proximate the first side of the graphene channel.

According to some embodiments, a semiconductor device comprises a substrate, a first active area over the substrate, a second active area over the substrate, a graphene channel between the first active area and the second active area, and a first in-plane gate. In some embodiments, the graphene channel has a first side and a second side. In some embodiments, the first in-plane gate is proximate the first side of the graphene channel. In some embodiments, the first in-plane gate comprises graphene.

According to some embodiments, a semiconductor device comprises a substrate, a first active area over the substrate, a second active area over the substrate, a graphene channel between the first active area and the second active area, a first in-plane gate and a second in-plane gate. In some embodiments, the graphene channel has a first side and a second side. In some embodiments, the first in-plane gate is proximate the first side of the graphene channel and the second in-plane gate is proximate the second side of the graphene channel. In some embodiments, the first in-plane gate and the second in-plane gate comprise graphene.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
    forming a dielectric layer;
    forming a carbon layer over the dielectric layer;
    forming a metal layer over the carbon layer;
    performing an anneal process, wherein at least some of the carbon layer is transformed into graphene during the anneal process;
    removing the metal layer after performing the anneal process; and
    etching the graphene to define a channel and a gate from the graphene.

2. The method of claim 1, wherein the etching comprises etching the graphene to further define a source/drain region from the graphene.

3. The method of claim 2, wherein, after the etching, the gate extends around the source/drain region from a first side of the channel to a second side of the channel opposite the first side.

4. The method of claim 1, wherein the etching comprises etching the graphene to further define a source/drain region from the graphene.

5. The method of claim 1, wherein the carbon layer is an amorphous carbon layer.

6. The method of claim 1, wherein the metal layer comprises at least one of nickel or copper.

7. The method of claim 1, wherein the removing comprises removing the metal layer using an acid solution.

8. The method of claim 1, wherein the removing comprises removing the metal layer using an oxygen plasma process.

9. The method of claim 1, wherein:
    the forming a dielectric layer comprises forming the dielectric layer over a first surface of a substrate, and
    the method comprises forming a second gate over a second surface of the substrate opposite the first surface.

10. A method of forming a semiconductor device, comprising:
    forming a carbon layer;
    performing an anneal process, wherein at least some of the carbon layer is transformed into graphene during the anneal process; and
    etching the graphene to define a channel and a gate from the graphene, wherein, after the etching, a top surface of the channel and a top surface of the gate are co-planar.

11. The method of claim 10, wherein the etching comprises etching the graphene to further define a source/drain region from the graphene.

12. The method of claim 11, wherein, after the etching, a top surface of the source/drain region is co-planar with the top surface of the channel.

13. The method of claim 10, comprising forming a source/drain region to contact the channel, wherein the source/drain region comprises a different material composition than the channel.

14. The method of claim 13, wherein, after the etching, the gate extends around the source/drain region from a first side of the channel to a second side of the channel opposite the first side.

15. The method of claim 10, comprising forming a metal layer over the carbon layer prior to the performing an anneal process.

16. The method of claim 15, comprising:
    removing the metal layer prior to etching the graphene.

17. The method of claim 10, comprising:
    forming a second gate, wherein a substrate is disposed between the gate and the second gate.

18. A method of forming a semiconductor device, comprising:
    forming a carbon layer over a dielectric layer;
    patterning the carbon layer to define a patterned carbon layer;
    forming a metal layer over the patterned carbon layer and the dielectric layer;
    performing a lift off process to remove at least some of the metal layer; and
    performing an anneal process, wherein at least some of the carbon layer is transformed into graphene during the anneal process to form a channel from the patterned carbon layer.

19. The method of claim 18, wherein at least some of the carbon layer is transformed into graphene during the anneal process to further form a gate from the patterned carbon layer.

20. The method of claim 18, wherein at least some of the carbon layer is transformed into graphene during the anneal process to further form a source/drain region from the patterned carbon layer.

* * * * *